US006624675B2

(12) United States Patent
Neron

(10) Patent No.: US 6,624,675 B2
(45) Date of Patent: Sep. 23, 2003

(54) FREE-RUNNING MODE DEVICE FOR PHASE LOCKED LOOP

(75) Inventor: Christophe Neron, Le Rouret (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/852,629

(22) Filed: May 11, 2001

(65) Prior Publication Data

US 2001/0030560 A1 Oct. 18, 2001

Related U.S. Application Data

(63) Continuation-in-part of application No. 09/379,923, filed on Aug. 24, 1999, now abandoned.

(51) Int. Cl.[7] ................................................ H03L 7/093

(52) U.S. Cl. ........................................ 327/157; 327/156

(58) Field of Search ................................ 327/156, 157, 327/146

(56) References Cited

U.S. PATENT DOCUMENTS

| | | | | |
|---|---|---|---|---|
| 5,103,192 A | * | 4/1992 | Sekine et al. | 327/157 |
| 5,272,453 A | | 12/1993 | Traynor et al. | 331/57 |
| 5,394,444 A | * | 2/1995 | Silvey et al. | 327/156 |
| 5,663,688 A | * | 9/1997 | Delmas et al. | 327/156 |
| 5,699,020 A | * | 12/1997 | Jefferson | 327/157 |
| 5,847,614 A | | 12/1998 | Gilbert et al. | 327/156 |
| 5,883,533 A | | 3/1999 | Matsuda et al. | 327/156 |
| 5,886,551 A | | 3/1999 | Narahara | 327/157 |
| 5,910,740 A | | 6/1999 | Underwood | 327/149 |
| 5,933,037 A | * | 8/1999 | Momtaz | 327/157 |
| 6,084,479 A | | 7/2000 | Duffy et al. | 331/17 |
| 6,304,147 B1 | * | 10/2001 | Bonnot | 327/156 |

FOREIGN PATENT DOCUMENTS

| | | |
|---|---|---|
| EP | 0 355 466 A2 | 2/1990 |
| EP | 0 360 442 A1 | 3/1996 |
| JP | 56 051140 A | 5/1981 |

OTHER PUBLICATIONS

MITEL, MT9042B:"Multitrunk System Synchronizer, Preliminary Information", pp. 3–97 to 3–121.

Neperud D: "Control Network to Prevent Railing of PLL With Loss of Reference Frequency", Motorola Technical Developments, Aug. 1, 1996,pp. 1–2, vol. 28, Motorola Inc., Schaumburg, Illinois, USA.

* cited by examiner

*Primary Examiner*—Dinh T. Le
(74) *Attorney, Agent, or Firm*—Mike Ure

(57) ABSTRACT

A P-stage shift register or counter is added to the charge pump and/or to the phase frequency detector of a phase locked loop circuit to keep the output clock stable enough from the locked frequency value and available for long enough after the input reference clock has been removed. This mode is called the phase locked loop (PLL) free running mode (FRM) and is activated as soon as the device has detected the loss of the input reference clock of the phase locked loop. Once the free running mode is activated the charge pump automatically enters its high impedance state resulting in a slower frequency shift process at the PLL output in comparison to a conventional PLL. This main advantage of this PLL circuit is that the system clock is kept running for long enough so that the system can issue a fault report through another logic and memory device when the reference clock is suddenly removed either accidentally or not.

12 Claims, 4 Drawing Sheets

FREE-RUNNING MODE DEVICE FOR PHASE LOCKED LOOP

This Application is a Continuation In Part of U.S. patent application Ser. No.: 09/379,923 filed Aug. 24, 1999 now abandoned.

FIELD OF THE INVENTION

This invention generally relates to a method and an apparatus for providing a phase locked loop circuit and in particular to providing a phase locked loop having a free-running mode.

BACKGROUND OF THE INVENTION

Phase locked loop circuits are widely used in many different applications, such as in communication and networking systems. For example, microprocessor chips require on-chip clock generation. A phase locked loop enables a precise tracking and phase locking of a synthesized clock signal to a reference clock signal.

Some prior art phase locked loops operate based on analog algorithms. Such systems are subject to very large phase errors and are heavily influenced by random noise. Because of the analog nature of such systems they are difficult to highly integrate. Also, functions such as a divide by N or edge registration are difficult to implement in an integrated device. Analog systems are also relatively susceptible to loss of phase lock or incapability of obtaining phase lock because of random variations in the system.

Other prior art phase locked loops operate based on digital algorithms. One such phase locked loop (PLL) is identified as MT9042B available from Mitel Corporation and is described in detail in Issue 11 of their publication "Digital Switching & Networking Components". If network synchronization is temporarily disrupted, the MT 9042B provides timing and synchronization signals based on storage techniques. The stored values are determined during synchronized mode when an external reference signal is available and the clock is locked to the external reference signal. When the external reference signal is lost, the stored values are used to attempt to maintain the output clock signal.

Further, U.S. Pat. No. 5,883,533 in the name of Matsuda and Nogami discloses a clock signal-generating device having an active and a spare clock selecting circuit connected to a PLL circuit. This PLL circuit operates similarly as the MT9042B in that it is based on storage techniques. The PLL circuit includes a holdover circuit for temporarily holding a signal output from the selecting circuit for a preselected period of time.

Similarly, U.S. Pat. No. 5,910,740 by Underwood discloses a phase locked loop having memory. This PLL also has a memory that enables highly precise tracking and phase locking of a synthesized clock signal to its reference clock signal.

It is an object of the present invention to provide a PLL having a slower frequency shift process at the PLL output in comparison to prior art PLLs.

Advantageously, the PLL in accordance with the invention allows the system clock to run long enough and stable enough for the PLL system to issue a fault report through another logic and memory device when the reference clock signal is lost.

SUMMARY OF THE INVENTION

In accordance with the invention there is provided a charge pump phase locked loop circuit for providing an output clock signal comprising: an input port for receiving a reference clock signal; a detector for receiving the reference clock signal and for detecting oscillations of the reference clock signal, the detector for comparing the output clock signal and the reference clock signal and determining an acceptability of the reference clock signal, for providing a first signal indicative of one of the reference clock signal being accepted as a reference clock and the reference clock signal being accepted as other than a reference clock; a charge pump circuit having output port, the charge pump circuit for providing a drive signal for varying a phase of the output clock signal and for receiving the first signal, the charge pump circuit for providing high impedance at the output port when the first signal indicates that the reference clock signal is accepted as other than a reference clock at the input port.

In accordance with another aspect of the invention there is further provided a method of providing a free-running mode for a phase locked loop including a charge pump circuit having an output port comprising the steps of: receiving a reference clock signal at an input port; determining oscillations of the received reference clock signal; determining an acceptability of the reference clock signal; providing a first signal to the charge pump circuit when the reference clock signal has a quality below a predetermined level; and providing high impedance at the output port of the charge pump circuit upon receipt of the first signal.

BRIEF DESCRIPTION OF THE DRAWINGS

Exemplary embodiments of the invention will now be described in accordance with the drawings in which.

DETAILED DESCRIPTION OF THE INVENTION

The method and the apparatus in accordance with the invention provide timing and synchronization signals between two nodes. A clock signal is phase locked to a reference signal.

Figure 1:
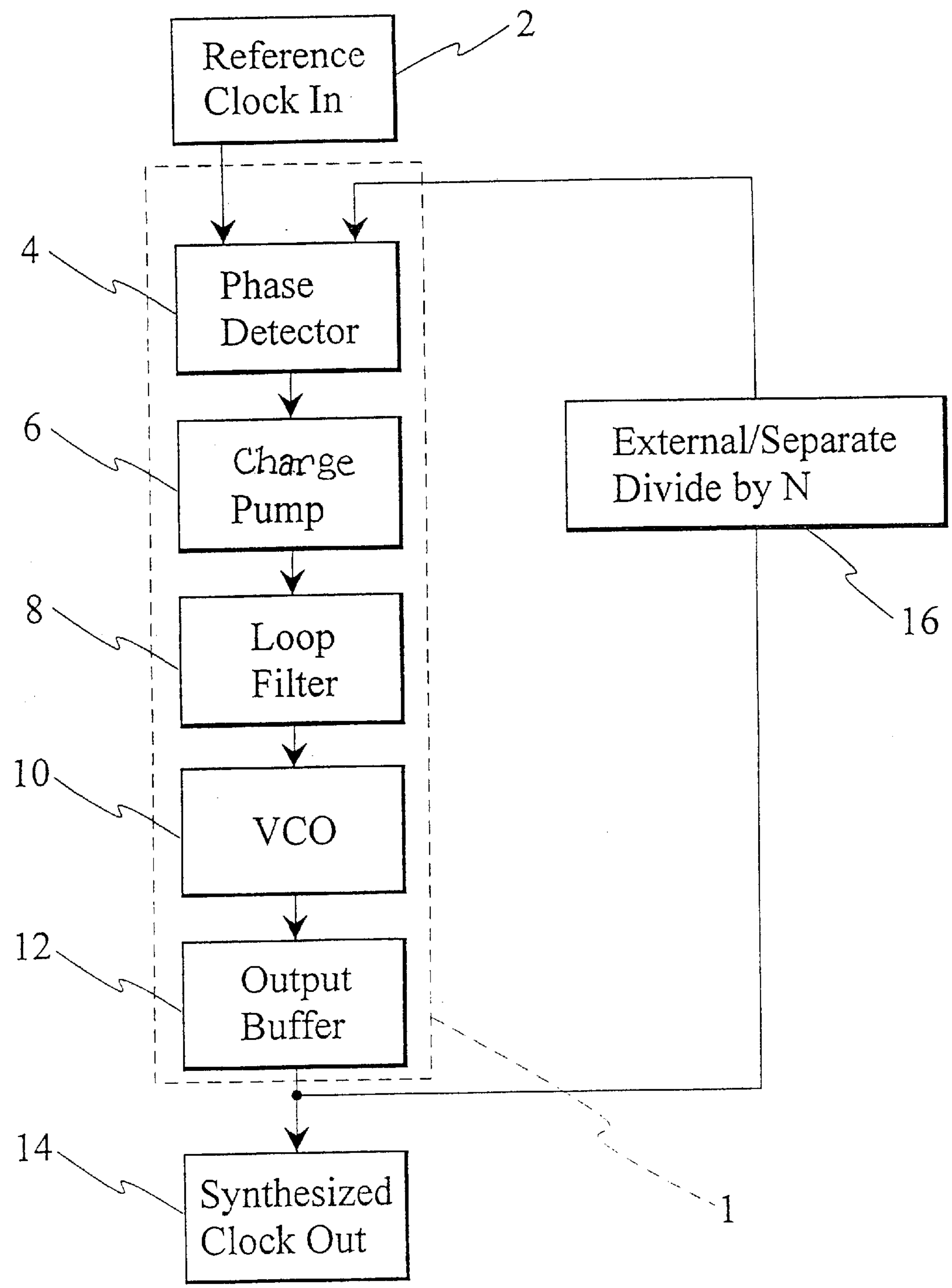
FIG. 1 shows a scheme of prior art analog phase locked loop circuit.

FIG. 1 shows a scheme of a prior art analog phase locked loop circuit 1 receiving a reference clock input signal 2 and generating a synthesized clock output signal 14. The analog phase locked loop circuit 1 has a phase detector 4 which receives the reference clock input signal 2 and divided clock signal generated by an external/separate divide by N circuit 16 derived from the synthesized clock output signal 14. A charge pump 6 and a loop filter 8 serially process the output of the phase detector 4 and the output drives a voltage-controlled oscillator (VCO) 10. The output of the VCO 10 is coupled to an output buffer 12 to produce the synthesized clock output signal 14. Use of analog phase locked loop circuit often result in large phase errors and are strongly influenced by random noise. Due to the analog nature of such prior art, they are susceptible to phase lock loss and sometimes are not able to obtain phase lock due to random variations in the system.

A conventional digital frequency multiplier is usually composed of an oscillator (VCO), a phase/frequency detector (PFD), a charge pump (CP), a loop filter (LPF) and a feedback divider (DIVM). Optionally one also incorporates a direct divider.

Figure 2:
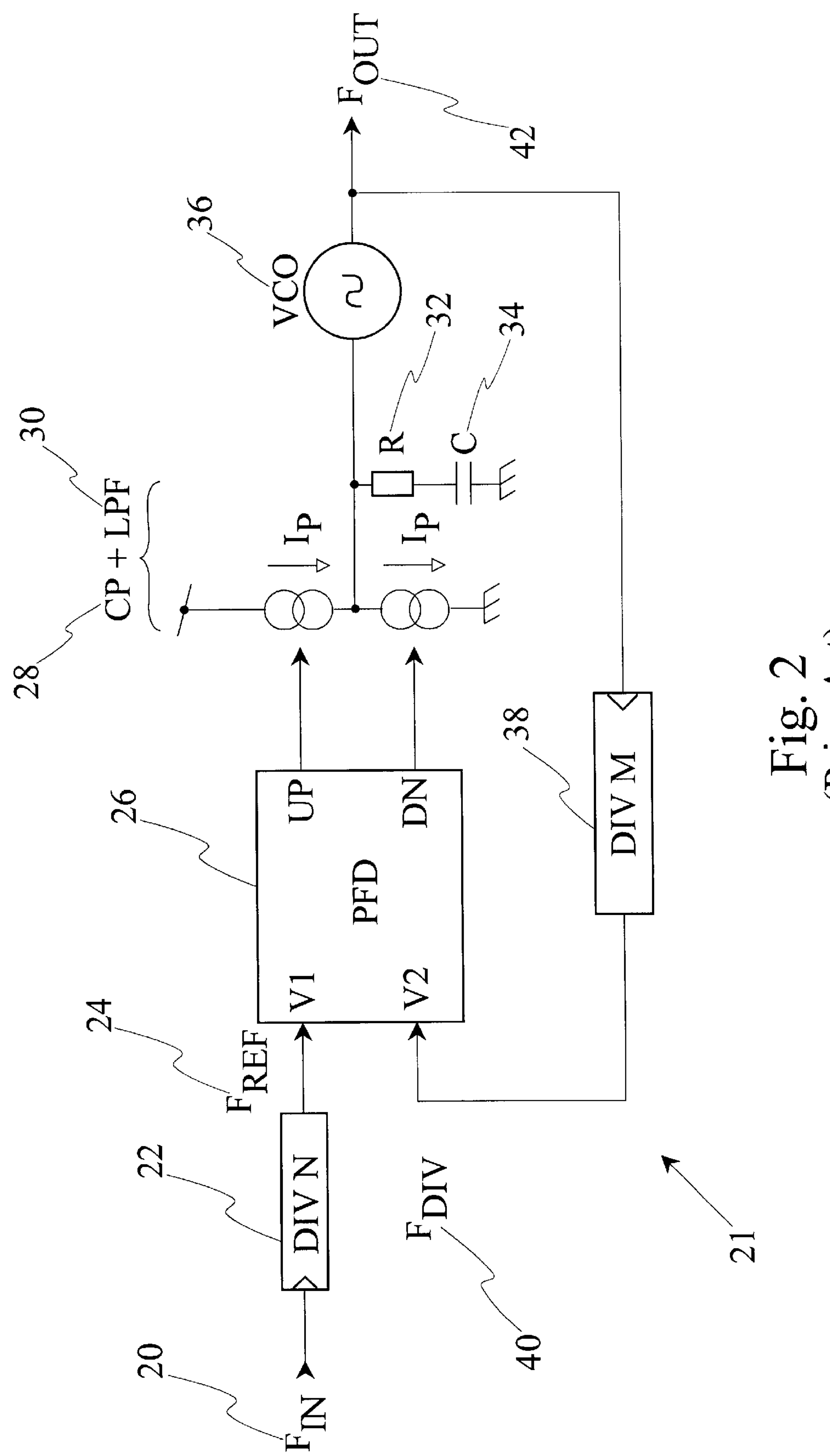
FIG. 2 shows a scheme of a conventional digital phase locked loop circuit.

FIG. 2 shows a block diagram of a conventional digital phase locked loop circuit 21 receiving a clock input signal 20 ($F_{iN}$). The clock input signal 20 is optionally directed through a divide by N circuit 22, which generates a divided clock signal to produce the reference signal 24 ($F_{REF}$). The reference signal 24 ($F_{REF}$) enters the phase/frequency detector 26 (PFD) and is stored as frequency 1 (v1). In operation, the PFD 26 compares the phase/frequency of the phase locked loop signal 40 ($F_{DiV}$) with the phase/frequency of the reference signal 24 ($F_{REF}$). The phase locked loop signal is stored in the PFD 26 as frequency 2 (v2). The PFD 26 then compares phase of v1 with that of v2. Based on this comparison, the PFD 26 furnishes either a UP (up) or DN (down) signal according to the phase/frequency difference between the $F_{REF}$ 24 and $F_{DiV}$ 40. Of course, when the reference signal 24 ($F_{REF}$) is temporarily lost an UP or DN signal is generated as well.

In normal mode, the UP signal is furnished successively within a period of time during which there is a phase difference between $F_{REF}$ 24 and $F_{DiV}$ 40. The pulse duration of the UP signal is proportional to the phase difference. The UP signal supplied by the PFD 26 is applied to the charge pump 28. The charge pump 28 supplies the voltage controlled oscillator (VCO) control voltage for controlling the oscillation frequency of the VCO 36 according to the UP signal and in cooperation with the loop filter 30 (LPF). The charge pump 28 supplies a charge to the LPF 30 or, alternatively, extracts a charge from the LPF 30 in accordance to the UP signal so as to cause the LPF 30 to produce the VCO control voltage. The VCO 36 oscillates to supply an output signal $F_{out}$ 42 having a frequency that differs according to the VCO control voltage furnished by the LPF 30. The divide by M frequency divider 38 (DIVM) receives the signal and divides its frequency by M to produce the signal $F_{DiV}$ applied to the PFD 26. The VCO 36 generates the output frequency 42 ($F_{out}$) based on the comparison between the reference frequency 24 ($F_{REF}$) and the frequency 40 ($F_{DiV}$).

In the case that the reference signal 24 ($F_{REF}$) is temporarily lost, it is often suggested to operate the PLL circuit in a holdover mode. The holdover mode is usually used for short duration, for example 2 seconds. In holdover mode timing and synchronization signals are not locked to the clock input signal 20, but are based on storage techniques. The storage value is determined while the device is in normal mode and locked to the clock input signal 20. Hence, if the PFD 26 does not receive the reference signal 24 ($F_{REF}$) it furnishes a DN signal. The DN signal supplied by the PFD 26 is applied to a resistance 32 and a capacitor 34. The resistance 32 and the capacitor 34 supply a control voltage to the VCO 36 based on a stored control voltage generated by the charge pump 28 and the LPF 30 while the PLL circuit 21 was running in normal mode. In the holdover mode, the VCO 36 generates an output frequency 42 ($F_{out}$) from stored values determined during operation in a normal mode.

In a conventional PLL circuit such as the PLL circuit 21 shown in FIG. 2, the DN (down) output of the phase/frequency detector is activated once the reference clock signal is lost. This results in a discharge of the loop filter capacitor. At first order it is apparent that the frequency derivative versus time observed at the PLL output is given by the following equation:

$$\frac{dF_{out}}{dt} = -\frac{(K_{VCO} * I_p)}{C} \quad \text{equation (1)}$$

Below there is presented a numerical example describing the operation of a conventional phase locked loop circuit.

$K_{vco}$=*VCO* gain=200MHz/V $I_p$=*CP* current=100 $\mu$A

*C*=*LPF* cap=200pF $$\frac{dF_{out}}{dt} = -100 \text{ MHz}/\mu\text{s}$$

Figure 3:
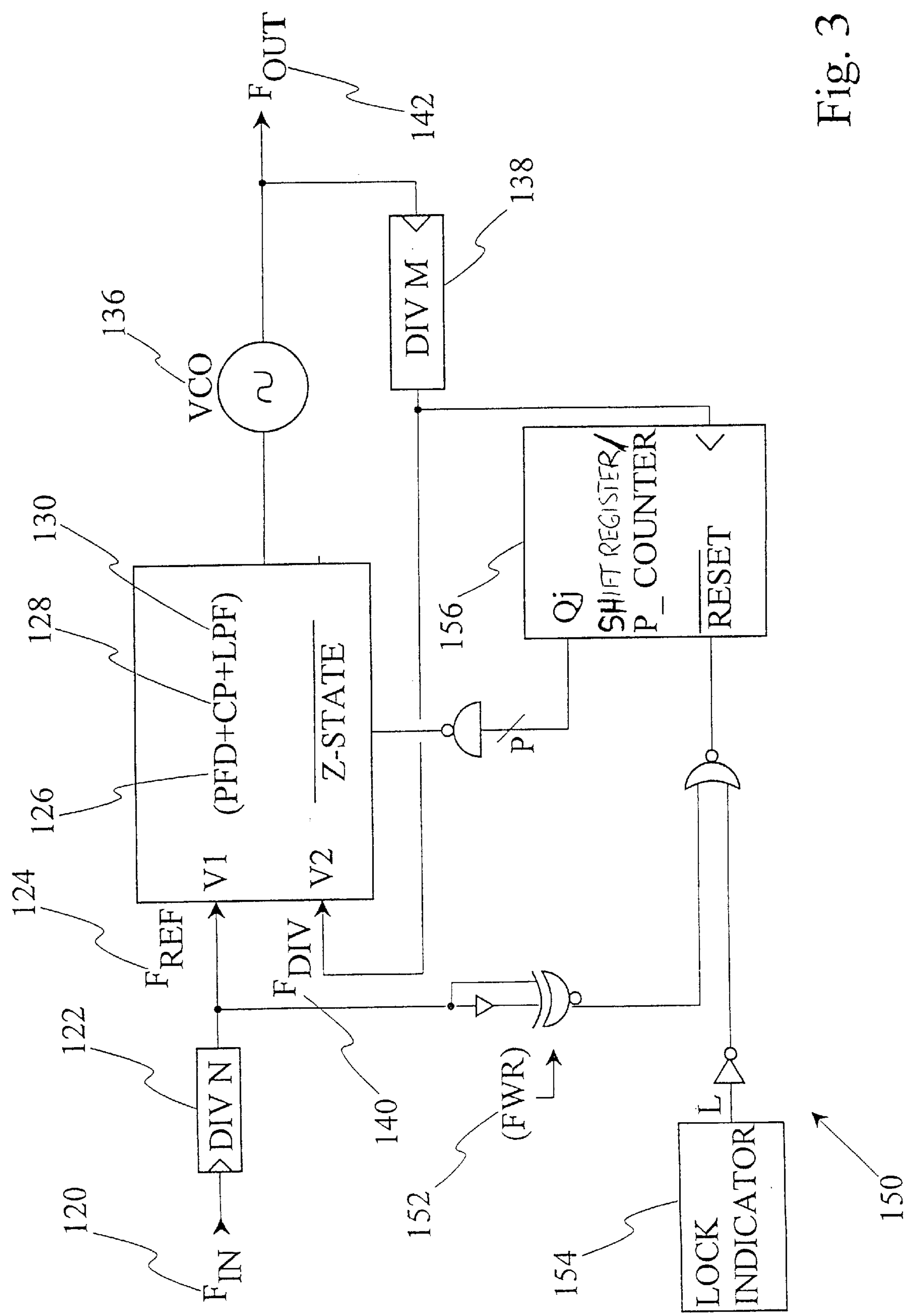
FIG. 3 shows a scheme of a digital phase locked loop circuit in accordance with the invention.

In order to achieve a much slower frequency derivative, the present invention replaces the term $I_p$ by a leakage current ($I_{leak}$) in the above-described equation. This is achieved by putting the charge pump in its high impedance mode soon after the loss of the reference clock signal is detected. Preferably, there is no unnecessary delay between detecting a loss of the reference clock signal and initiating a high impedance output from the charge pump. This is shown in FIG. 3 presenting a block diagram of a digital phase locked loop circuit 150 in accordance with the invention receiving a clock input signal 120 ($F_{iN}$). The clock input signal 120 is optionally directed through a divide by N circuit 122, which generates a divided clock signal to produce the reference signal 124 ($F_{REF}$). The reference signal 124 ($F_{REF}$) enters a phase/frequency detector 126 (PFD), a charge pump 128, and a loop filter 130, and is stored as frequency 1 (v1). In operation, the PFD 126, the charge pump 128, and the loop filter 130 compare the phase/frequency of the phase locked signal 140 ($F_{DiV}$) with the phase/frequency of the reference signal 124 ($F_{REF}$). The phase locked signal 140 ($F_{DiV}$) is stored in the PFD 126, the charge pump 128, and the loop filter 130 as frequency 2 (v2). The PFD 126, the charge pump 128, and the loop filter 130 then compare the frequency v1 with the frequency v2. Based on this comparison the PFD 126 in cooperation with the charge pump 128 and the loop filter 130 furnishes a control voltage for controlling the oscillation of a VCO 136 and hence the output signal 142 ($F_{out}$). The charge pump 128 supplies a charge to the LPF 130 or, alternatively, extracts a charge from the LPF 130 in accordance to the phase locked loop signal 140 ($F_{DiV}$) signal so as to cause the LPF 130 to produce the VCO control voltage. The VCO 136 oscillates to supply an output signal $F_{out}$ 142 having a frequency that differs according to the VCO control voltage furnished by the LPF 130. The control voltage is generated according to the phase/frequency difference between signal $F_{REF}$ 124 and signal $F_{Div}$ 140 or the temporary loss of the reference signal 124 ($F_{REF}$).

Optionally, a divide by M circuit 138 is used so that a direct comparison of the reference signal 124 ($F_{REF}$) with the phase locked loop signal 140 ($F_{DiV}$) is possible. The divide by M frequency divider 138 (DIVM) receives the signal and divides its frequency by M to produce the signal $F_{DiV}$ 140 applied to the PFD 126. The VCO 136 generates the output frequency 142 ($F_{out}$) based on the comparison between the reference frequency 124 ($F_{REF}$) and the frequency 140 ($F_{DiV}$).

A P-stage shift register or P-counter 156 is added to the charge pump 128 and/or to the phase frequency detector 126 of the phase locked loop (PLL) circuit to keep the output clock stable enough from the locked frequency value and available for long enough, e.g. a few hundred μs for instance, after the input reference clock has been removed. In accordance with the invention, this mode is called the phase locked loop (PLL) free running mode (FRM) and is activated as soon as the device has detected the loss of the input reference clock of the PLL. When the free running mode is activated, the charge pump automatically enters its high impedance state, tri-state, resulting in a slower frequency shift of the output frequency 142 ($F_{out}$) in contrast to conventional phase locked loop circuits. The advantage of the PLL circuit in accordance with the invention is that the output clock is stable enough and runs long enough so that the system can issue a fault report through another logic or memory device when the reference clock is suddenly removed whether the removal of the reference clock occurs by accident or not. Also, since the reference clock is lost, it is useful to limit clock drift using a high impedance input to the VCO 136 to keep the clock at approximately its correct frequency. Of course, phase alignment is irrelevant when no reference signal exists.

In order to achieve the slower frequency derivative in accordance with an embodiment of the invention the term $I_P$ in equation (1) described above is replaced with a leakage current ($I_{leak}$). This means, that the charge pump is put in its high impedance state as soon as the loss of the reference signal is detected. The main principle is to employ a further detector in a form for example of a P-stage shift register or counter 156 toggled by the feedback clock ($F_{Div}$) and reset by the reference clock ($F_{ref}$). If the reference clock disappears the shift register will overflow in a few clock cycles in dependence upon P. When this happens, the phase frequency detector 126/ charge pump 128 enters a high impedance state.

The use of a Full Wave Rectifier 152 (FWR or frequency doubler) as shown in FIG. 3 is optional and is included in the PLL circuit 150 if the final state of the reference clock is not exactly known, i.e. either 1 or 0, once the reference clock is stopped.

Further, the circuit presented in FIG. 3 depicts the use of a lock indicator 154 as part of the PLL circuit 150. The use of such a lock indicator is optional and is used if the application of the PLL circuit in accordance with the invention requires that the input clock signal 120 (FIN) be reduced to a lower value, and hence it avoids the P-counter clock 156 becoming much faster than its reset clock, thereby avoiding a start of a false free running mode. If a lock indicator is used, the free running mode will only be activated if the phase locked loop circuit 150 is already locked.

Preferably, the number of stages in the P-stage shift register 156 is as low as possible to detect the loss of the reference clock as fast as possible. Typically 2 or 3 stages are employed in the P-stage shift register 158.

Figure 4:
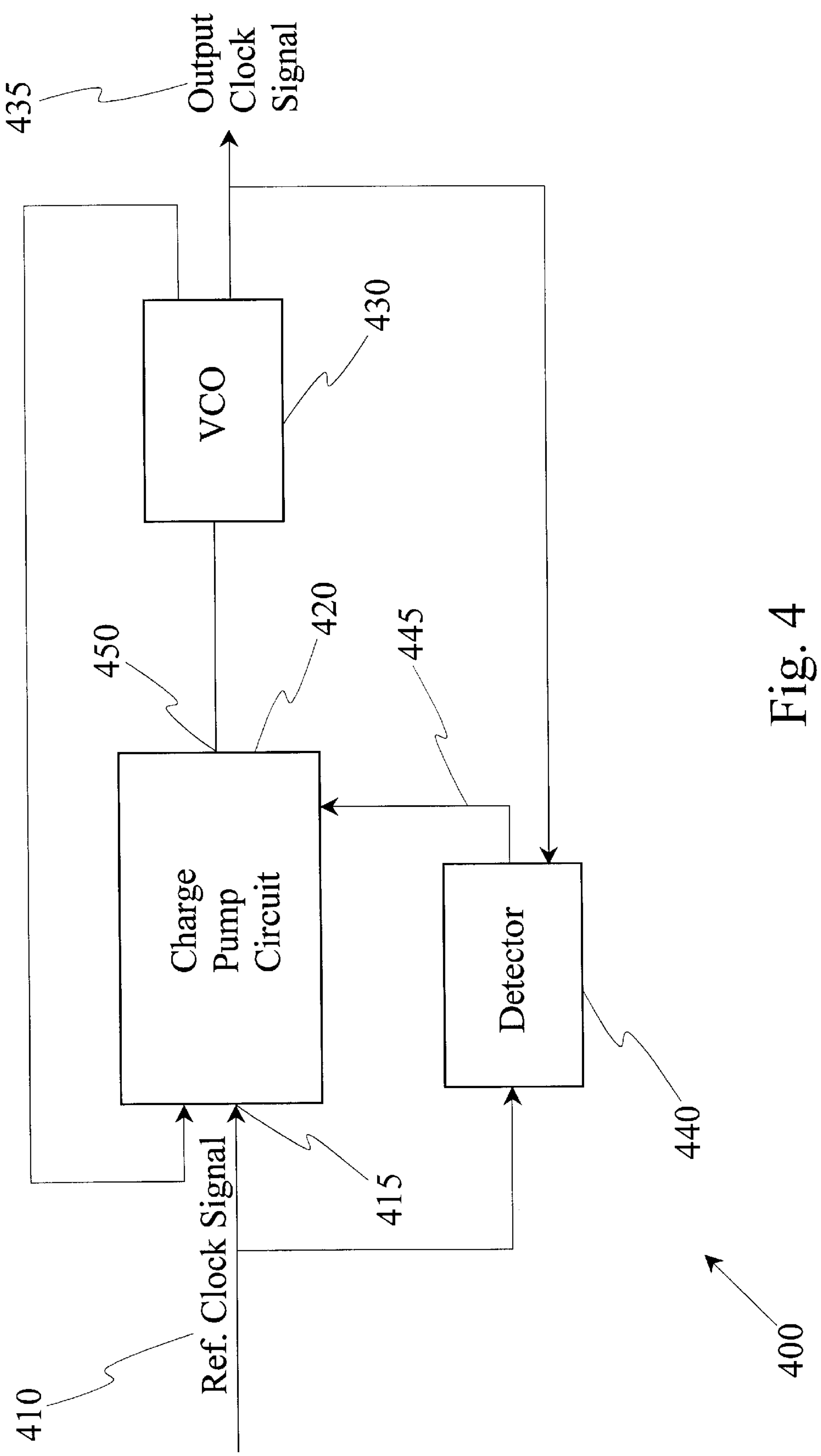
FIG. 4 shows a simplified scheme of the digital phase locked loop circuit in accordance with the invention.

FIG. 4 shows a charge pump phase locked loop circuit 400 that provides an output clock signal 435. A reference clock signal 410 enters the charge pump phase locked loop circuit 400 at input port 415. A detector 440 detects an aspect of the reference clock signal 410 and provides a first signal 445 that is indicative of a suitability of the reference clock signal 410 as a reference clock. The first signal 445 enters the charge pump phase locked loop circuit 400 at input port 415. A charge pump circuit 420 receives the reference clock signal 410 and the first signal 445. This charge pump circuit 420 has an output port 450 and provides a drive signal for varying a phase of the output clock signal 435. The charge pump circuit 420 further receives the first signal 445 and provides high impedance at the output port when the first signal 445 is indicative of a reference clock signal 410 unsuitable for use as a reference clock at the input port 415.

A voltage controlled oscillation circuit 430 receives the drive signal from the charge pump circuit 420 and provides the output clock signal 435 which has an oscillation frequency controlled in dependence upon the drive signal. The detector 440 receives the reference clock signal and compares phases of the first signal 445 derived from the output clock signal 435 and the reference clock signal 410 with each other and then furnishes a comparison result indicative of a phase alignment of the signals. The charge pump circuit 420 has an input port, which receives the comparison result and provides the drive signal in dependence upon the received comparison result.

The above-described embodiments of the invention are intended to be examples of the present invention and numerous modifications, variations, and adaptations may be made to the particular embodiments of the invention without departing from the scope and spirit of the invention, which is defined in the claims.

What is claimed is:

1. A charge pump phase locked loop circuit for providing an output clock signal comprising:

a controlled oscillator responsive to a drive signal for producing the output clock signal;

a detector responsive to the output clock signal and a reference clock signal to generate a first signal indicating whether the reference clock signal is operational; and means, including a charge pump circuit, having an input port to receive the first signal, another input port to receive the reference clock signal, and an output port to provide the drive signal for varying a phase of the output clock signal, wherein the charge pump circuit is placed in a high impedance mode when the first signal indicates that the reference clock signal is not operational.

2. The charge pump phase lock loop circuit of claim 1, wherein the first signal indicates that the reference clock signal is not operational when the reference clock signal is absent.

3. The charge pump phase lock loop circuit of claim 1, wherein the detector is further equipped to detect oscillations of the reference clock signal, and indicate that the reference clock signal is not operational when the detected oscillations fall below a determined threshold.

4. The charge pump phase lock loop circuit of claim 1, wherein the detector compares phases of the first signal derived from the output clock signal and the reference clock signal with each other, and provides a comparison result indicative of phase alignment of the signals; and wherein the charge pump circuit receives the comparison result and provides the drive signal in dependence upon the received comparison result.

5. The charge pump phase lock loop circuit of claim 4, further comprising:

a programmable divider for dividing the output clock signal to provide the first signal based upon the divided output clock signal.

6. A method of providing a free-running mode for a phase locked loop including a charge pump circuit having an output port at which a drive signal is produced, the method comprising:

controlling an oscillator in accordance with the drive signal for producing an output clock signal;

receiving a reference clock signal at an input port;

determining whether the reference clock signal is operational based upon oscillations of the received reference clock signal;

providing a first signal to the charge pump circuit when the reference clock signal is not operational; and placing the charge pump circuit in a high impedance mode upon receipt of the first signal.

7. A charge pump phase locked loop circuit for providing an output clock signal comprising:

a controlled oscillator responsive to a drive signal for producing the output clock signal;

a detector responsive to the output clock signal and a reference clock signal to generate a first signal indicating whether the reference clock signal is operational, wherein the detector comprises a counter having a count threshold such that the counter is periodically reset by the reference clock signal to keep the counter from exceeding the count threshold, resulting in the first signal indicating that the reference clock signal is operational, when the reference clock signal oscillates within an acceptable frequency range, and such that the counter exceeds the count threshold, resulting in the first signal indicating that the reference clock signal is not operational, when the reference clock signal ceases to oscillate; and means, including a charge pump circuit, having an input port to receive the first signal, another input port to receive the reference clock signal, and an output port to provide the drive signal far varying a phase of the output clock signal, wherein the charge pump circuit is placed in a high impedance mode when the first signal indicates that the reference clock signal is not operational.

8. The charge pump phase locked loop circuit of claim 7, further comprising:

a lock indicator to detect phase lock between the reference clock signal and the output clock signal, and to provide a phase lock signal to the detector indicating the presence or absence of the phase lock, wherein when the phase lock signal indicates that the reference clock signal and the output clock signal are not phase locked, the detector generates the first signal indicating that the reference clock signal is operational.

9. A charge pump phase locked loop circuit for providing an output clock signal comprising:

a controlled oscillator responsive to a drive signal for producing the output clock signal;

a detector responsive to the output clock signal and a reference clock signal to generate a first signal indicating whether the reference clock signal is operational, wherein the detector comprises a shift register having a shift amount threshold determined such that the shift register is periodically reset by the reference clock signal to keep the shift register from shifting past the shift amount threshold, resulting in the first signal indicating that the reference clock signal is operational, the shift register shifting past the shift amount threshold resulting in the first signal indicating that the reference clock signal is not operational; and means, including a charge pump circuit, having an input port to receive the first signal, another input port to receive the reference clock signal, and an output port to provide a drive signal for varying a phase of the output clock signal, wherein the charge pump circuit is placed in a high impedance mode when the first signal indicates that the reference clock signal is not operational.

10. A method for providing a free-running mode for a phase locked loop including a charge pump circuit having an input port and an output port at which a drive signal is produced, the method comprising:

controlling an oscillator in accordance with the drive signal for producing an output clock signal;

receiving a reference clock signal at an input port;

determining whether the reference clock signal is operational based upon oscillations of the received clock signal;

providing a first signal to the charge pump circuit when said reference clock signal is not operational; and placing the charge pump circuit in a high impedance mode upon receipt of the first signal;

wherein determining whether the reference clock signal is operational further comprises counting oscillations within the output clock signal, and determining upon reaching a threshold count of oscillations that the reference clock signal is not operational.

11. A method for providing a free-running mode for a phase locked loop including a charge pump circuit having an input port and an output port at which a drive signal is produced, the method comprising:

controlling an oscillator in accordance with the drive signal for producing an output clock signal;

receiving a reference clock signal at an input port;

determining whether the reference clock signal is operational based upon oscillations of the received clock signal;

providing a first signal to the charge pump circuit when said reference clock signal is not operational; and placing the charge pump circuit in a high impedance mode upon receipt of the first signal;

wherein providing said first signal to the charge pump circuit further comprises providing a lock indicator signal to indicate a phase relationship between the reference clock signal and the output clock signal, and only providing said first signal to the charge pump circuit when the lock indicator signal is indicative of a lock condition.

12. A method for providing a free-running mode for a phase locked loop including a charge pump circuit having an input port and an output port at which a drive signal is produced, the method comprising:

controlling an oscillator in accordance with the drive signal for producing an output clock signal;

receiving a reference clock signal at an input port;

determining whether the reference clock signal is operational based upon oscillations of the received clock signal;

providing a first signal to the charge pump circuit when the reference clock signal is not operational; and placing the charge pump circuit in a high impedance mode upon receipt of the first signal;

wherein determining whether the reference clock signal is operational further comprises shifting a value into a shift register at a frequency of an oscillating signal, resetting the shift register in dependence upon the reference clock signal, and determining that the reference clock signal is not operational when the value is shifted a predetermined amount.

* * * * *